United States Patent [19]
Banakis et al.

[11] Patent Number: 5,653,596
[45] Date of Patent: Aug. 5, 1997

[54] GROUNDING SYSTEM FOR PC CARDS

[75] Inventors: Emanuel G. Banakis, Naperville; Frank A. Harwath, Downers Grove, both of Ill.

[73] Assignee: Molex Incorporated, Lisle, Ill.

[21] Appl. No.: 459,137

[22] Filed: Jun. 2, 1995

[51] Int. Cl.6 .................................................. H01R 9/09
[52] U.S. Cl. ........................... 439/64; 439/946; 361/752
[58] Field of Search .............................. 439/64, 159, 753, 439/108, 95, 79-81, 84, 153, 155, 157, 160; 361/753

[56] References Cited

U.S. PATENT DOCUMENTS

| | | | |
|---|---|---|---|
| 4,602,835 | 7/1986 | Bauer et al. | 439/64 X |
| 4,624,517 | 11/1986 | Anhalt et al. | 439/108 X |
| 4,789,347 | 12/1988 | Banjo et al. | 439/140 |
| 4,838,804 | 6/1989 | Banjo et al. | 439/325 |
| 4,872,091 | 10/1989 | Maniwa et al. | 361/424 |
| 4,926,034 | 5/1990 | Banjo et al. | 235/492 |
| 4,955,817 | 9/1990 | Sugai | 439/60 |
| 5,288,247 | 2/1994 | Kaufman | 439/607 |
| 5,305,180 | 4/1994 | Mitchell et al. | 361/685 |
| 5,308,251 | 5/1994 | Kaufman et al. | 439/64 |
| 5,357,402 | 10/1994 | Anhalt | 439/64 X |
| 5,451,168 | 9/1995 | Shuey | 439/159 |
| 5,478,246 | 12/1995 | Cheng | 361/753 X |
| 5,502,620 | 3/1996 | Funck et al. | 361/753 |

FOREIGN PATENT DOCUMENTS

| | | | |
|---|---|---|---|
| 0406610A2 | 6/1990 | European Pat. Off. | G06K 19/06 |
| WO93/17471 | 9/1993 | WIPO | H01R 13/648 |

*Primary Examiner*—Allan N. Shoap
*Assistant Examiner*—Christopher J. McDonald
*Attorney, Agent, or Firm*—Stacey E. Caldwell

[57] ABSTRACT

A grounding system is provided for an electrical connector assembly which provides an interconnection between a PC card and a main printed circuit board. A header connector is mounted on the main printed circuit board and receives the PC card. Mating terminals are provided on the header connector and a receptacle connector on the PC card for interconnection of the PC card to electrical circuit traces on the main printed circuit board. At least one header grounding contact is mounted on the header connector adjacent to but spaced from the terminals and coupled to a logic ground circuit on the main printed circuit board. A card grounding contact is mounted on the PC card near the front insertion end thereof for engaging the header grounding contact and commoning the logic ground circuit of the main printed circuit board to a logic ground circuit on the PC card to provide a low impedance ground return.

10 Claims, 5 Drawing Sheets

GROUNDING SYSTEM FOR PC CARDS

FIELD OF THE INVENTION

This invention generally relates to the art of PC cards and, particularly, to a PC card and electrical connector assembly having an improved grounding system.

BACKGROUND OF THE INVENTION

Generally, PC cards, such as memory cards, are data input devices which are electrically connected to an electronic apparatus or storage device, such as a word processor, personal computer or other electronic apparatus. The data stored in the PC card is transferred to the electronic apparatus. Memory cards are portable instruments which are readily inserted and extracted from a connector apparatus which may be used with the PC card for removably coupling the PC card to a printed circuit board, for instance.

A PC card conventionally includes a frame which usually is generally rectangular and includes an opening in either a top surface or a bottom surface thereof or, in some constructions, in both surfaces. The opening receives a circuit board assembly, and a panel or cover closes the opening and encloses the circuit board assembly within the frame. Often, a pair of panels or covers sandwich the frame and the circuit board assembly therebetween.

The circuit board assembly of a PC card conventionally includes a generally planar dielectric substrate with circuit traces and at least one electrical component mounted thereon. The electrical component(s) may include semiconductor devices, integrated circuits, batteries or the like.

One of the problems associated with PC cards involves the build-up of electrical charges in the PC card. Specifically, charges are generated in the PC card during handling since the card generally is a portable instrument often carried on a human body. When a card bearing charges is inserted into an electronic apparatus or the connector thereof, the charges flow to the electronic apparatus through the connecting terminals of the connector. The charges can result in damage to or ultimate failure of the integrated circuits or other circuit elements on the card as well as the electronic apparatus itself.

Consequently, a typical PC card is shielded by making the panels or cover conductive to protect the electrical circuitry, and in particular, the electromagnetic signals, from externally generated radiated emissions. The card is also provided with EMI or grounding contacts along outside edges thereof to provide early discharge of internally generally static electricity in order to minimize the effects of electromagnetic pulses created during the dissipation of static charges through the signal contacts. Typically (according to such standards as PCMCIA), two grounding locations are established on the outside edges of the PC card with corresponding grounding contacts inside the guide arms of a card-receiving header connector. However, this standard grounding configuration is only intended for reduction of ESD and EMI/RFI effects, and does not address the effects of signal distortion. That is to say, in a given electrical circuit with given inductance and resistance values, the current flowing through the signal terminals must be balanced with the current flowing through the ground returns. If this balance is not achieved, voltage build-up can occur on the ground, or reference conductors, thus distorting the electrical signals and creating "ground bounce". Furthermore, at high switching speeds, the existing ground pins in the header are often insufficient, and if the grounding locations connected to the grounding contacts inside the guide arms are also connected to the ground pins within the header, it may cause a current to flow from the ground pins through the conductive cover and to the guide grounds thus creating a "ground loop".

One method of adding ground paths in parallel to decrease voltage build-up and minimize the occurrence of ground bounce is disclosed in U.S. Pat. No. 5,288,247 to Kaufman, dated Feb. 22, 1994. In that design, a grounding shroud is placed around a card-receiving header connector which shroud includes a plurality of contacts which engage a portion of a PC card shell and balances the ground returns with the current flow of the system.

However, the approach disclosed in the '247 patent does not solve the problem of ground loops and actually can contribute further to grounding and shielding complications. Since the ground loop flowing through the cover may create radiation and result in an antenna-like effect instead of providing a shielding function, thus further comprising the grounding function of the card.

The present invention is directed to solving the problems discussed above and providing an improved grounding system in a connector assembly for a PC card.

SUMMARY OF THE INVENTION

An object, therefore, of the invention is to provide a new and improved grounding system in an electrical connector assembly which provides an interconnection between a PC card and a main printed circuit board.

In the exemplary embodiment of the invention, the electrical connector assembly includes a header connector for mounting on the main printed circuit board and into which the PC card is inserted and ejected. A plurality of terminals are mounted on the header connector and are adapted for interconnection of the PC card to electrical circuit traces on the main printed circuit board. At least one header grounding contact is mounted on the header connector adjacent to but spaced from the terminals and adapted for engagement with a logic ground circuit on the main printed circuit board to provide a low impedance ground return thereto.

The PC card includes a generally rectangular frame having a front insertion end, a rear end and opposite longitudinal sides joining the ends. A circuit board assembly is mounted on the frame and includes a generally planar dielectric substrate having an earth ground circuit and at least one electrical component mounted thereon. A receptacle connector is provided at the front insertion end of the frame for mating with the header connector. A plurality of terminals are mounted on the receptacle connector for connection to the terminals of the header connector and for mechanically and electrically engaging appropriate circuitry on the circuit board assembly. A pair of cover panels sandwich the circuit board assembly therebetween leaving at least a mating face of the receptacle connector exposed for mating with the header connector, with at least one of the cover panels being conductive. At least one conductive ground clip is mounted on a side of the frame remote from the front insertion end thereof for commoning the earth ground circuit of the circuit board assembly to retain an earth ground on the main printed circuit board through a corresponding conductive ground terminal in the header connector. At least one card grounding contact is mounted on the frame near the front insertion end thereof and is electrically isolated from the conductive cover panel for engaging the header grounding contact on the header connector and connecting, through the card and header grounding contacts, a logic ground circuit on the circuit board assembly to the logic ground circuit on the main printed circuit board.

As disclosed herein, at least one third conductive ground member may be secured between the conductive cover panel and the generally planar dielectric substrate of the circuit board assembly. The third conductive ground member is adapted to connect a third ground circuit means on the substrate to the conductive cover panel.

In addition, at least one of the terminals on the header connector and at least one of the terminals on the receptacle connector comprise mating ground terminals adapted for interconnection to common the logic ground circuit on the main printed circuit board with the logic ground circuit on the circuit board assembly. In particular, some of the terminals on the header connector and some of the terminals on the receptacle connector comprise mating signal terminals. The ground terminals are configured to mate prior to the signal terminals, i.e., "first make, last break", when the PC card is inserted into the header connector.

In the preferred embodiment of the invention, the terminals on the header connector and the terminals on the receptacle connector are arranged in an elongated array along the header connector and the front insertion end of the generally rectangular frame, respectively. One of the header grounding contacts and one of the card grounding contacts are provided at each end of the elongated array. In essence, the card grounding contacts are mounted on the sides of the frame spaced forwardly of the ground clips. The grounding contacts are recessed inwardly of the frame ground clips.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENTS

Figure 1:
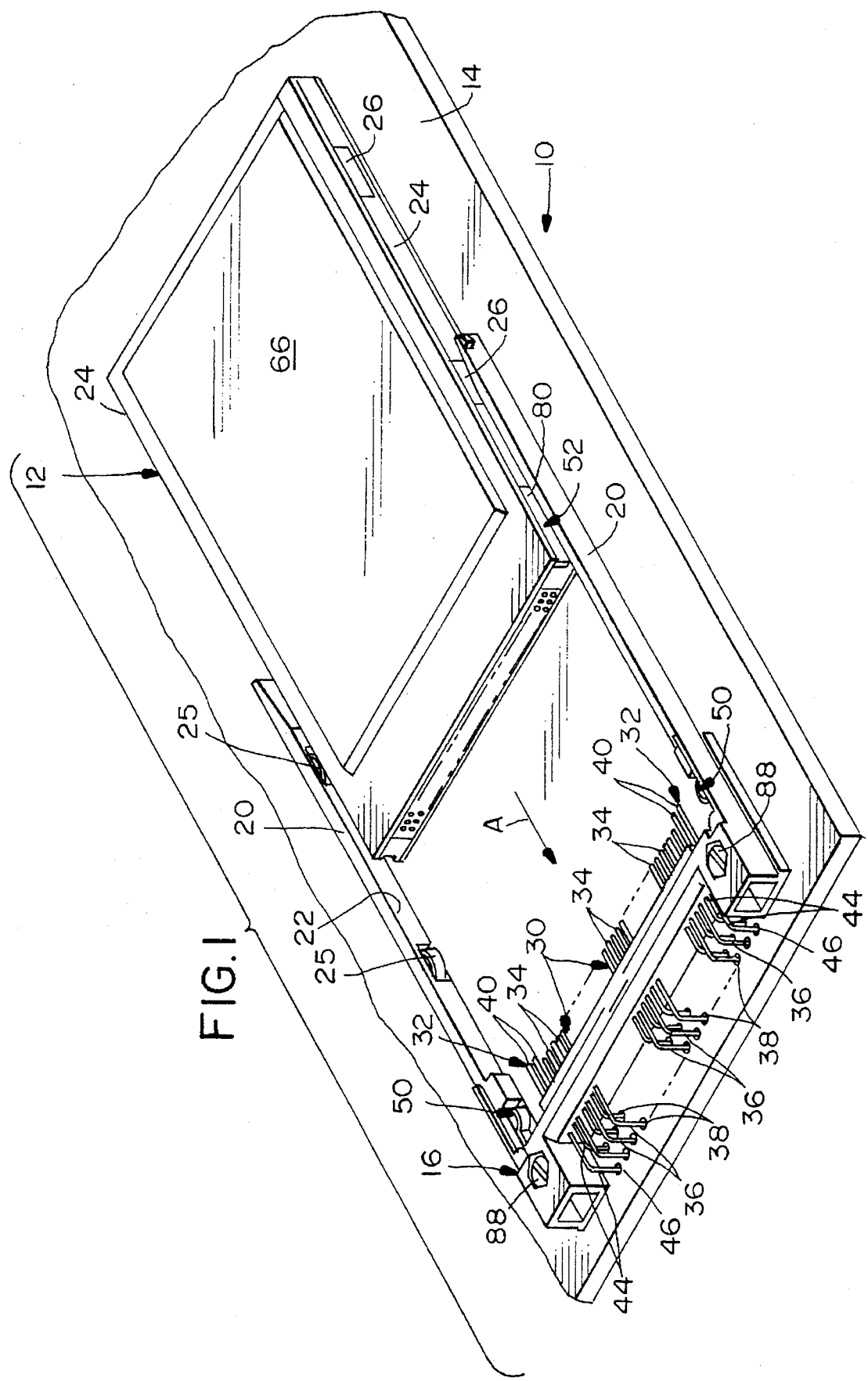
FIG. 1 is an exploded perspective view of an electrical connector assembly which provides an interconnection between a PC card and a main printed circuit board, and incorporating the grounding system of the invention.
Figure 2:
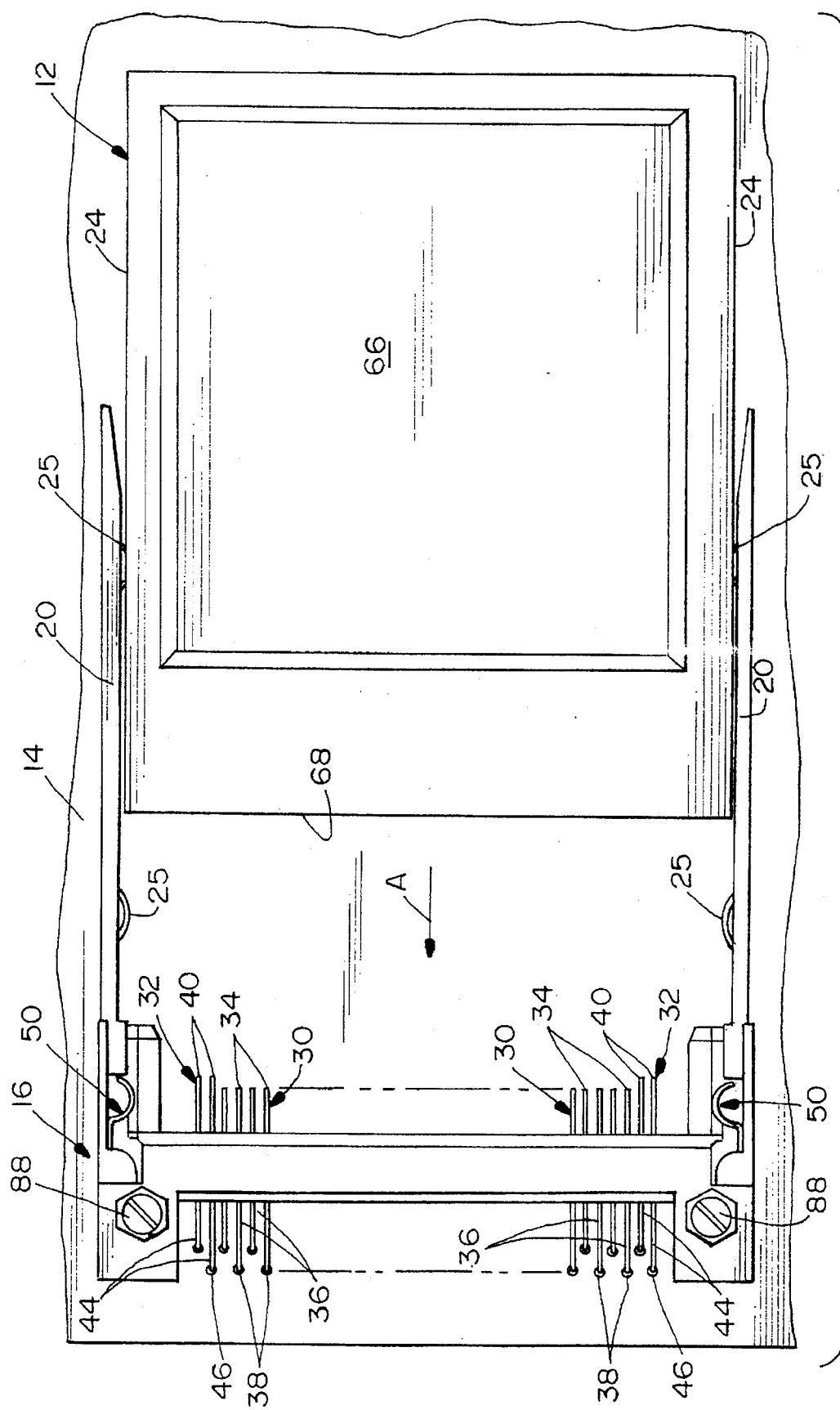
FIG. 2 is a top plan view of the assembly of FIG. 1.

Referring to the drawings in greater detail, and first to FIGS. 1 and 2, the grounding system of the invention is incorporated in an electrical connector assembly, generally designated 10, which provides an interconnection between a PC card, generally designated 12, and a main printed circuit board 14. The connector assembly includes a header connector, generally designated 16, which is mateable with a receptacle connector, generally designated 18, of PC card 12. The PC card is inserted into the header connector in the direction of arrows "A" and may be ejected from the header connector opposite that direction by an ejector mechanism (not shown) mounted on the header connector.

More particularly, header connector 16 is adapted for mounting on main printed circuit board 14. The connector includes a pair of side arms 20 having inwardly facing guide channels 22 between which opposite side edges 24 of PC card 12 are slidably inserted. A pair of header ground clips 25 are mounted within each guide channel 22 for engaging a pair of complementary card ground clips 26 on each opposite side edge 24 of PC card 12. Header ground clips 25 are electrically coupled to an earth ground on main printed circuit board 14, and card ground clips 26 are coupled to conductive covers (described hereinafter) of PC card 12 so that upon contacting the header ground clips, the card ground clips provide electrostatic discharge (ESD) protection for the PC card and the internal electronic circuitry of the card.

Header connector 16 includes an elongated transverse body 28 which mounts a plurality of signal terminals, generally designated 30, and end ground terminals, generally designated 32. Signal terminals 30 have terminal pins 34 for insertion into mating receptacle terminals 35 (FIG. 1) mounted in receptacle connector 18 of PC card 12. The signal terminals also have tail portions 36 for insertion into appropriate holes 38 in main printed circuit board 14 for electrical connection to signal circuit traces on the board and/or in the holes, as by soldering.

Preferably, two end-most terminals in the illustrated longitudinal array thereof comprise ground terminals 32 having ground pins 40 for insertion into ground receptacle terminals 42 mounted in receptacle connector 18 at opposite ends of the terminal array thereof. Like the signal terminals, the ground terminals have tail portions 44 for insertion into appropriate holes 46 in main printed circuit board 14. The ground terminals are electrically connected, as by soldering, to ground circuit traces on the main printed circuit board to provide a low impedance ground return thereto. It can be seen in FIGS. 1, 2 and 4 that ground pins 40 of ground terminals 32 are longer than terminal pins 34 of signal terminals 30 so that the ground pins mate with ground receptacle terminals 42 of receptacle connector 18 prior to the mating engagement of terminal pins 34 of the signal terminals with their respective receptacle terminals 35 in the receptacle connector.

Lastly, header connector 16 includes a header grounding contact, generally designated 50, adjacent to but spaced from the array of terminals at opposite ends thereof. As will be described hereinafter, each header grounding contact 50 is adapted for engaging a card grounding contact, generally designated 52 (FIG. 1) at opposite sides of PC card 12 at opposite ends of the receptacle connector 18 thereof. Header grounding contacts 50 are adapted for electrical coupling to a logic ground circuit on the main printed circuit board 14 to balance the ground return, i.e. to provide additional ground paths, with the current flowing through signal terminals 30.

Figure 3:
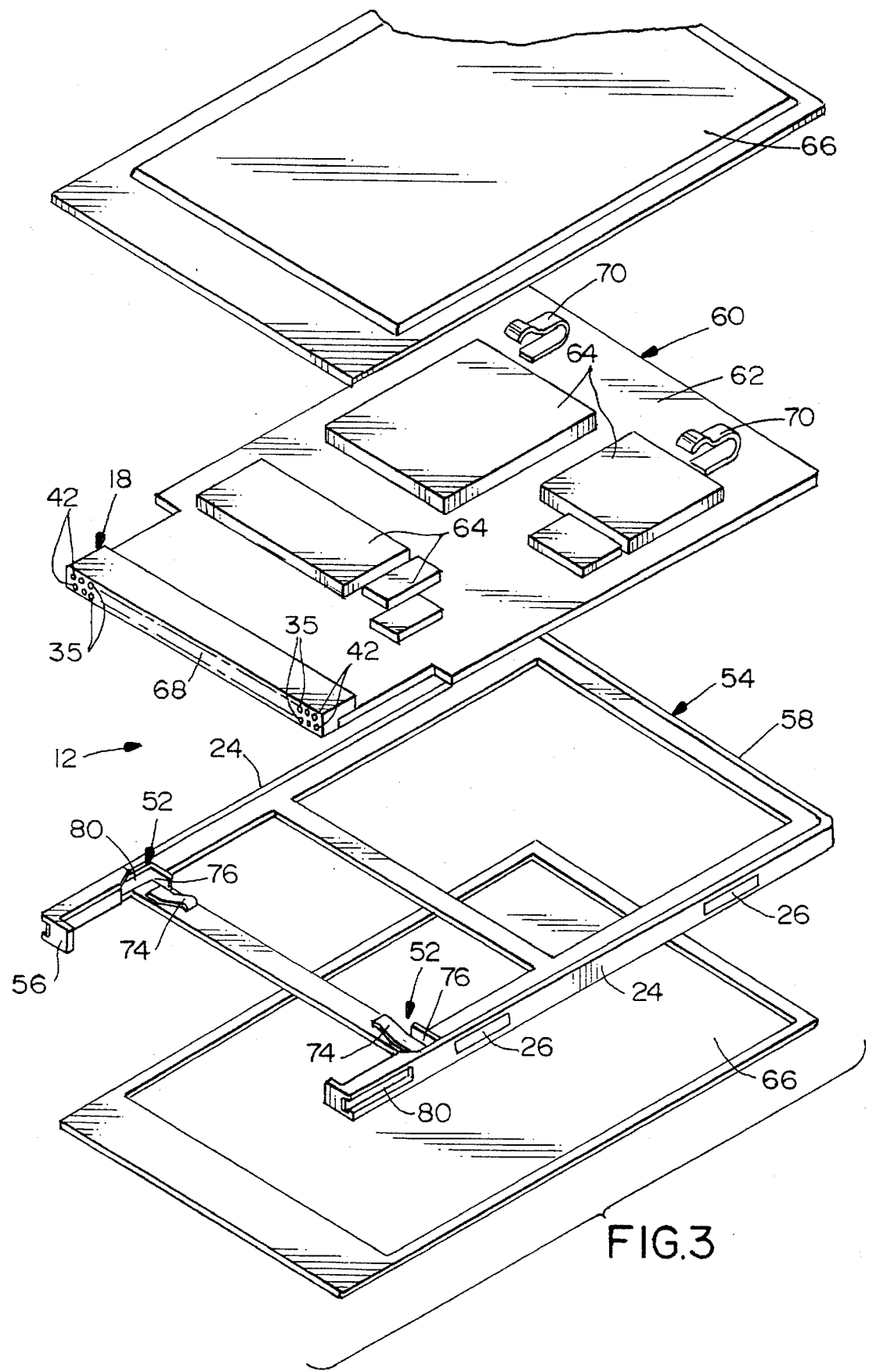
FIG. 3 is an exploded perspective view of the PC card.

Referring to FIG. 3 in conjunction with FIGS. 1 and 2, PC card 12 includes a generally rectangular frame, generally designated 54 in FIG. 3. The frame has a front insertion end 56, a rear end 58 and opposite longitudinal sides joining the ends and defining side edges 24 of the PC card.

A circuit board assembly, generally designated 60, is mounted within frame 54 of PC card 12. The circuit board assembly includes a generally planar dielectric substrate 62 having circuitry, including an earth ground circuit, thereon in the form of circuit traces which are not shown in order to avoid overly cluttering the depiction of the drawings. One or more electrical components are mounted on substrate 62 and are electrically coupled to the circuit traces on the substrate. It can be seen that receptacle connector 18 is mounted at front insertion end 56 of frame 54 for mating with header connector 16.

A pair of cover panels 66 are mounted on opposite sides of frame 54 and sandwich the frame and circuit board assembly 60 therebetween. The covers leave a mating face 68 of receptacle connector 18 exposed for mating with the header connector. At least one of the cover panels is fabricated of conductive material, such as stamped metal. In the preferred embodiment, both covers 66 are of conductive material.

Secondly, card ground clips 26 at opposite sides of frame 54 are effective to electrically couple cover panels 66 with header ground clips 25 on header connector 16 and, in turn, to the earth ground or chassis on main printed circuit board 14. Card ground clips 26 therefore electrically common the earth ground circuit on circuit board assembly 60 to the earth ground circuit of the main printed circuit board. Card ground clips 26 and header ground clips 25 function as providing electrostatic discharge protection and do not address the effects of signal distortion in the electrical connector assembly.

The problems of signal distortion are addressed by ground terminals 32 of header connector 16 mating with receptacle ground terminals 42 in receptacle connector 18 of the PC card. In particular, the ground terminals are arranged and coupled to the logic or common ground circuit means on main printed circuit board 14 to provide a low impedance ground return. However, such ground returns are not sufficient in many applications. That is to say, in a given electrical circuit, the current flowing through the signal terminals must be balanced with the current flowing through the ground returns. If this balance is not achieved, voltage build-up can occur and a ground current can form. Furthermore, in low voltage applications, this voltage build-up can be particularly harmful if it approaches the operating voltage of the system or application. For instance, there may be as many as forty five signal terminals 30 which will be mated and electrically "switched" with receptacle signal terminals 35 of PC card 12, all at the same time. Therefore, additional low impedance ground returns must be provided, in addition to that provided by ground terminals 32. The additional ground return must be separate and independent from the shielding or EMI/RFI covers to prevent current loops from being formed, resulting in the conductive cover panels functioning as antennas rather than EMI/RFI shields. Consequently, the invention contemplates the provision of header ground contacts 50 on header connector 16 and card grounding contacts 52 on PC card 12 as described briefly above.

Figure 5:
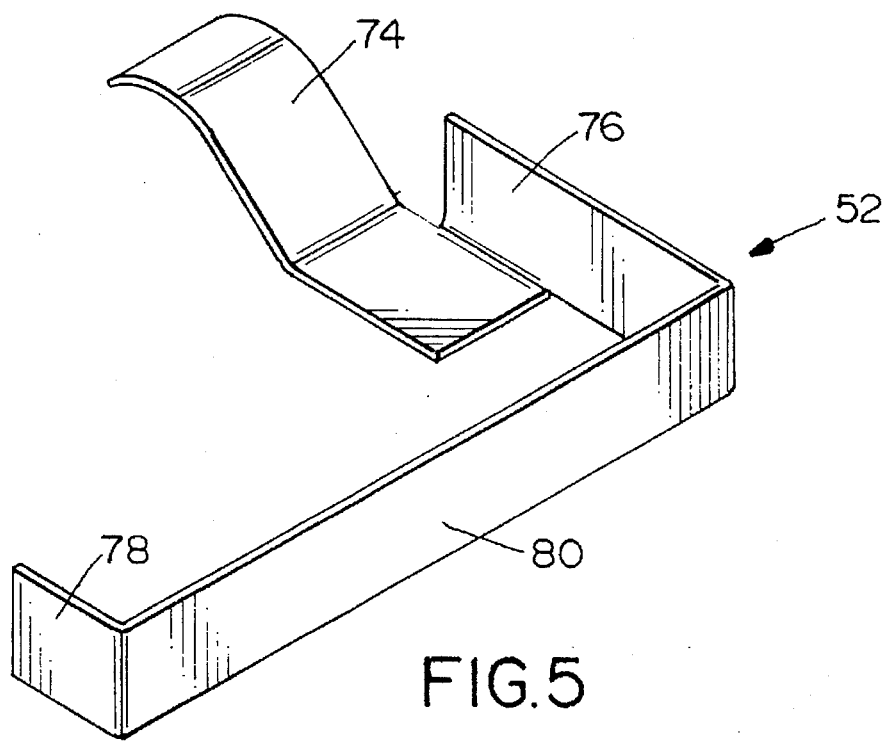
FIG. 5 is an enlarged perspective view of one of the grounding contacts on the PC card.

More particularly, referring to FIG. 5 in conjunction with FIGS. 1–3, each card grounding contact 52 includes a cantilevered spring arm portion 74 joined to one leg portion 76 of a generally U-shaped frame which includes a second leg portion 78, with a cross portion 80 joining the two leg portions. As seen best in FIGS. 1–3, cross portion 80 of each card grounding contact 52 is exposed outside the PC card at opposite ends of receptacle connector 18. Leg portions 78 project inwardly over the front face 68 of the receptacle connector at opposite ends thereof. Leg portions 76 project into the interior of PC card 12, and cantilevered spring arm portion 74 is effective to biasingly interengage the logic ground circuit on substrate 62 of circuit board assembly 60. Therefore, the logic ground circuit of the circuit board assembly becomes exposed exteriorly by cross portions 80 of grounding contacts 52 for engaging header grounding contacts 50 on header connector 16, as described below. It should be noted that cross portions 80 of card grounding contacts 52 are recessed inwardly of side edges 24 of the PC card, as best seen in FIG. 2, so that card grounding contacts 52 do not engage header ground clips 25 (FIG. 1) on side arms 20 of the header connector when the PC card is inserted into the header connector.

Figure 4:
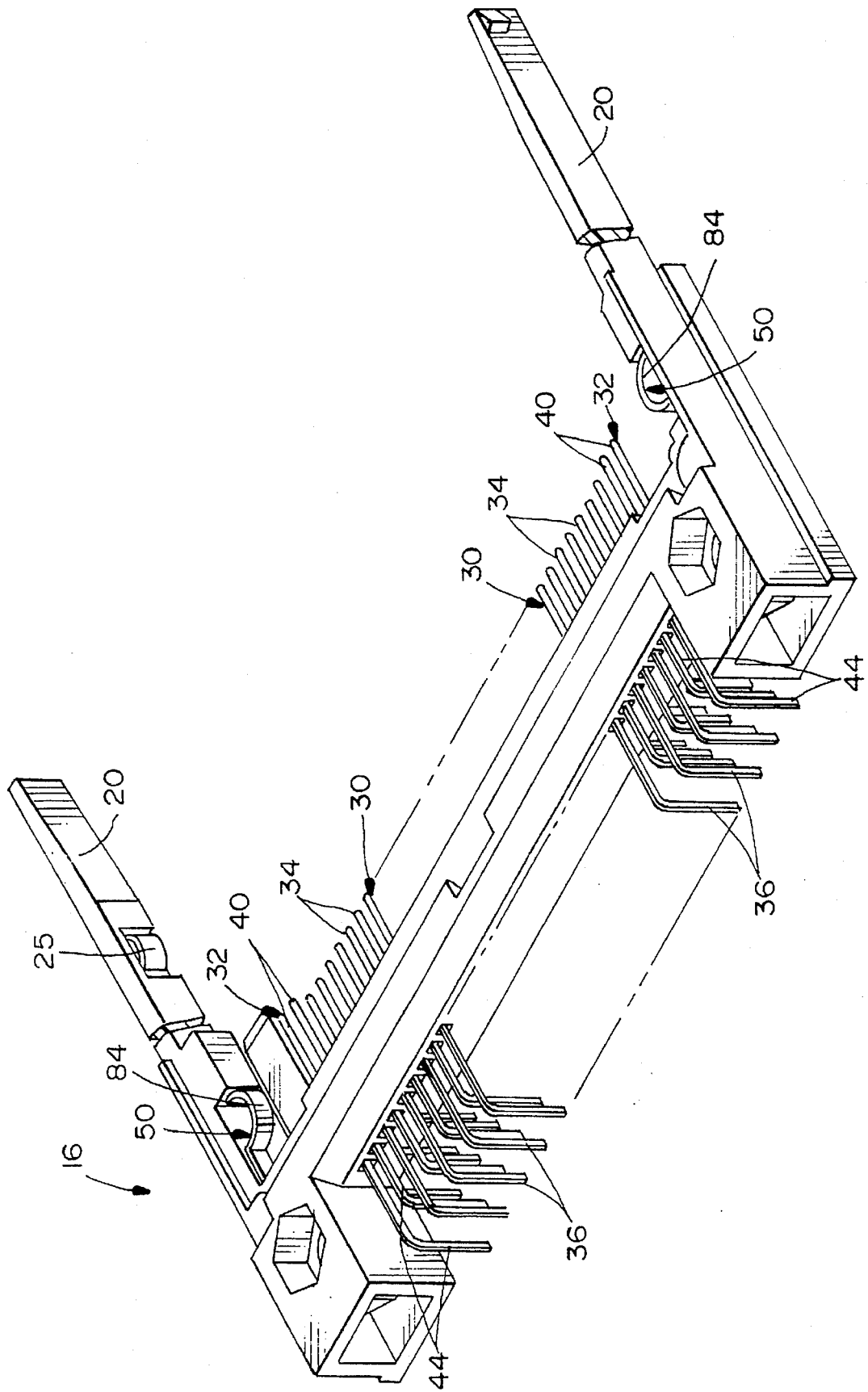
FIG. 4 is an enlarged perspective view of the header connector.
Figure 6:
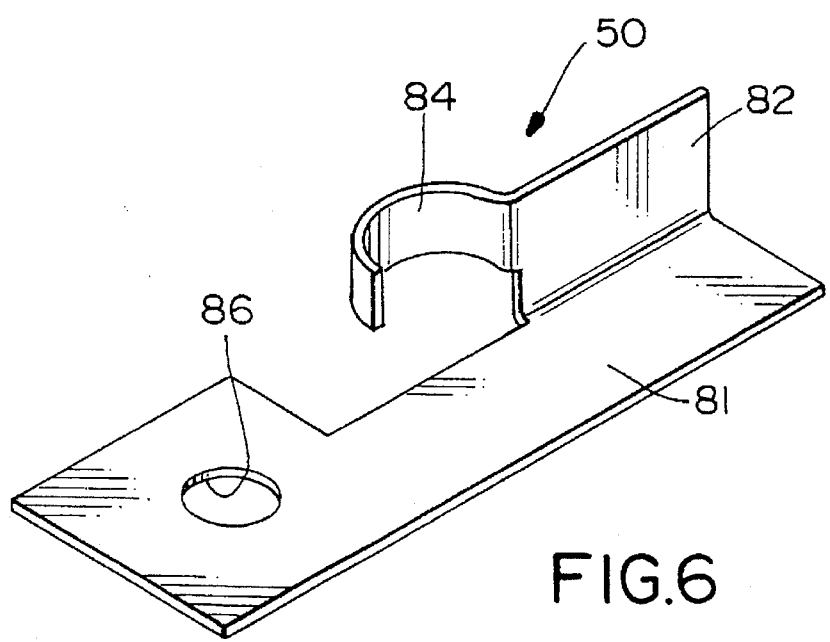
FIG. 6 is an enlarged perspective view of one of the grounding contacts on the header connector.

Referring to FIG. 6 in conjunction with FIGS. 1, 2 and 4, each header grounding contact 50 has a flat base 81 and an upstanding arm 82 which, in turn, joins a curved contact portion 84. An aperture 86 is formed in flat base 81 of each header grounding contact 50 for receiving therethrough appropriate fasteners, such as screws 88 (FIG. 1), which mount the header connector to main printed circuit board 14. Flat base 81 is adapted for electrical connection, as by soldering, to the logic ground circuit on main printed circuit board 14. Curved contact portions 84 of header grounding contact 50 project inwardly for engaging cross portions 80 of card grounding contact 52 on PC card 12 when the card is inserted into the header connector. Therefore, additional low impedance ground return circuits are provided from the PC card circuitry to the main printed circuit board to thereby increase the ground to signal ratio of the overall connector assembly and provide an improved interconnection between PC card 12 and main printed circuit board 14.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. A grounding system in an electrical connector assembly which provides an interconnection between a PC card and a main printed circuit board, comprising:

a header connector for mounting on the main printed circuit board and into which the PC card is inserted and ejected, a plurality of terminals on the header connector and adapted for interconnection of the PC card to electrical circuit traces on the main printed circuit board, and at least one header grounding contact on the header connector adjacent to but spaced from the terminals and adapted to be coupled to a logic ground circuit on the main printed circuit board to provide a low impedance ground return thereto; and a PC card including a generally rectangular frame having a front insertion end, a rear end and opposite longitudinal sides joining the ends, a circuit board assembly mounted on the frame and including a generally planar dielectric substrate having an earth ground circuit and at least one electrical component mounted thereon, a receptacle connector at the front insertion end of the frame for mating with the header connector, a plurality of terminals on the receptacle connector for connection to the terminals of the header connector and adapted for mechanically and electrically engaging appropriate circuitry on the circuit board assembly, a pair of cover panels sandwiching the circuit board assembly therebetween leaving at least a mating face of the receptacle connector exposed for mating with the header connector and at least one of the cover panels being conductive, at least one card ground clip on a side of the frame remote from said front insertion end thereof for commoning the earth ground circuit of the circuit board assembly to an earth ground on the main printed circuit board to discharge static electricity built up in the card upon insertion of the card into the header connector, and at least one card grounding contact on the frame near said front insertion end thereof and electrically isolated from the conductive cover panel and from the earth ground circuit for engaging the header grounding contact and thereby commoning the logic ground circuit on the main printed circuit board to a logic ground circuit on the circuit board assembly to balance current flowing through the electrical connector assembly.

2. The grounding system of claim 1 wherein at least one of the terminals on the header connector and at least one of the terminals on the receptacle connector comprise mating ground terminals adapted for interconnection to common the logic ground circuit on the main printed circuit board with the logic ground circuit on the circuit board assembly, and some of the terminals on the header connector and some of the terminals on the receptacle connector comprise mating signal terminals, wherein the header grounding contact and the card grounding contact provide additional ground connections to common the logic ground circuits of the main printed circuit board and the circuit board assembly by balancing the current flowing through the signal terminals with the current flowing through the ground terminals and grounding contacts.

3. The grounding system of claim 2 wherein said ground terminals are configured for interengagement prior to said signal terminals when the PC card is inserted into the header connector.

4. The grounding system of claim 1 wherein the terminals on the header connector and the terminals on the receptacle connector are arranged in an elongated array along the header connector and the front insertion end of the generally rectangular frame, respectively, and including one of said header grounding contact and one of said card grounding contact at each end of the elongated array.

5. The grounding system of claim 1 wherein said card grounding contact is mounted on said side of the frame spaced forwardly of the card ground clip.

6. The grounding system of claim 5, wherein the card grounding contact is recessed inwardly of the frame from the card ground clips.

7. A grounding system in an electrical connector assembly which provides an interconnection between a PC card and a main printed circuit board, comprising:

a header connector for mounting on the main printed circuit board and into which the PC card is inserted and ejected, a plurality of terminals on the header connector including at least one ground terminal and one signal terminal and adapted for interconnection of the PC card to electrical circuit traces on the main printed circuit board, and at least one header grounding contact on the header connector adjacent to but spaced from the terminals and adapted to be electrically coupled to a logic ground circuit on the main printed circuit board; and a PC card including a generally rectangular frame having a front insertion end, a rear end and opposite, longitudinal sides joining the ends, a circuit board assembly mounted on the frame and including a generally planar dielectric substrate having an earth ground circuit and at least one electrical component mounted thereon, a receptacle connector at the front insertion end of the frame for mating with the header connector, a plurality of terminals on the receptacle connector for connection to the terminals of the header connector including at least one ground terminal for mating to the ground terminal of the header connector and at least one signal terminal for mating to the signal terminal of the header connector and adapted for mechanically and electrically engaging appropriate circuitry on the circuit board assembly, a pair of cover panels sandwiching the circuit board assembly therebetween leaving at least a mating face of the receptacle connector exposed for mating with the header connector and at least one of the cover panels being conductive, and at least one card grounding contact on the frame near said front insertion end thereof electrically isolated from the earth ground circuit and adjacent to and spaced from the terminals on the receptacle connector for engaging the header grounding contact wherein the mating ground terminals and the interengaging grounding contacts connect the logic ground circuit on the main printed circuit board to a logic ground circuit on the circuit board assembly and provide a low impedance ground return within the electrical connector assembly by balancing the current flowing through the signal terminals with the current flowing through the ground terminals and ground contacts.

8. The grounding system of claim 7 wherein said ground terminals are configured for mating engagement prior to said signal terminals when the PC card is inserted into the header connector.

9. The grounding system of claim 7, wherein the card grounding contact is recessed inwardly of the frame.

10. A grounding system in an electrical connector assembly which provides an interconnection between a PC card and a main printed circuit board, comprising:

a header connector for mounting on the main printed circuit board and into which the PC card is inserted and ejected, a plurality of terminals on the header connector and adapted for interconnection of the PC card to electrical circuit traces on the main printed circuit board wherein at least one of the terminals comprise a ground terminal and the others comprise signal terminals, and at least one header grounding contact on the header connector spaced from the terminals and adapted to be coupled to a logic ground circuit on the main printed circuit board; and a PC card including a generally rectangular frame having a front insertion end, a rear end and opposite longitudinal sides joining the ends, a circuit board assembly mounted on the frame and including a generally planar dielectric substrate having logic ground circuit and at least one electrical component mounted thereon, a receptacle connector at the front insertion end of the frame for mating with the header connector, a plurality of terminals on the receptacle connector for connection to the terminals of the header connector and adapted for mechanically and electrically engaging appropriate circuitry on the circuit board assembly wherein at least one of the terminals comprise a ground terminal for mating with the ground terminal of the header connector and the others comprise signal terminals for mating to the signal terminals of the header connector and wherein the ground terminals are configured for interengagement prior to said signal terminals when the PC card is inserted into the header connector, at least one card grounding contact on the frame spaced from the terminals on the receptacle connector for engaging the header grounding contact on the header connector wherein the ground terminal on the header connector and the ground terminal on the receptacle connector are adapted to interengage along with the grounding contacts to common the logic ground circuit on the main printed circuit board to a logic ground circuit on the circuit board assembly and to provide a low impedance ground return between the header connector and the PC card.

* * * * *